United States Patent
Kumon et al.

(10) Patent No.: US 6,673,516 B2
(45) Date of Patent: Jan. 6, 2004

(54) COATING COMPOSITION FOR CHEMICALLY AMPLIFIED POSITIVE RESIST AND METHOD OF PATTERNING RESIST USING THE SAME

(75) Inventors: Satoshi Kumon, Kanagawa (JP); Kazufumi Sato, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 214 days.

(21) Appl. No.: 09/985,860

(22) Filed: Nov. 6, 2001

(65) Prior Publication Data
US 2002/0055063 A1 May 9, 2002

(30) Foreign Application Priority Data
Nov. 7, 2000 (JP) ......................................... 2000-338906

(51) Int. Cl.[7] .............................. G03C 1/73; G03C 1/52; G03F 7/039; G03F 7/30
(52) U.S. Cl. .................... 430/270.1; 430/326; 430/914; 430/905; 430/919; 430/921; 430/327; 430/328; 430/330; 430/331
(58) Field of Search ............................... 430/270.1, 326, 430/914, 905, 919, 921, 327, 328, 330, 331

(56) References Cited

U.S. PATENT DOCUMENTS 4,845,008 A 7/1989 Nishioka et al.
6,180,316 B1 * 1/2001 Kajita et al. ............. 430/270.1

FOREIGN PATENT DOCUMENTS

EP 0 510 671 A1 10/1992
JP 4-29146 1/1992
JP 6-130665 5/1994

OTHER PUBLICATIONS

Derwent English Abstract for JP 4–29146 (Kamiya et al.), Jan. 1992.*

* cited by examiner

Primary Examiner—Janet Baxter
Assistant Examiner—Sin J. Lee
(74) Attorney, Agent, or Firm—Sughrue Mion, PLLC

(57) ABSTRACT

A coating composition for a chemically amplified positive resist includes (A) an acid generator which generates an acid upon irradiation with active light or radiant ray, (B) a resin ingredient which exhibits increased solubility in an alkaline aqueous solution by action of an acid, (C) an organic solvent, and (D) an octanone in a proportion of from 0.1 to 5 parts by weight relative to 100 parts by weight of the ingredient (B). Using this coating composition, a method of patterning a resist. The coating composition and the method can yield a positive resist having improved definition and depth of focus.

12 Claims, No Drawings

COATING COMPOSITION FOR CHEMICALLY AMPLIFIED POSITIVE RESIST AND METHOD OF PATTERNING RESIST USING THE SAME

BACKGROUND OF THE INVENTION (1) Field of the Invention

The present invention relates to a coating composition for a chemically amplified positive resist and to a method of patterning a resist using the coating composition.

(2) Description of the Related Art

Lithographic processes requiring the definition in the vicinity of 0.25 μm and using a chemically amplified positive resist have been launched in practical applications. Separately, with an increasing demand on semiconductor devices having less sizes, next-generation processes requiring fine patterns of from 0.13 μm to 0.22 μm using KrF excimer laser have been developed.

Under these circumstances, a demand has been made on improvement of the characteristics of resists such as sensitivity, definition and resist pattern sectional shapes (profiles). The present invention is aimed specifically to the definition and depth of focus.

Conventional positive resist compositions each containing 3-octanone as a resist solvent are described in Japanese Unexamined Patent Application Publications No. 5-34919, No. 4-29146, No. 62-251739 and No. 62-194249. These positive resist compositions are, however, positive resist compositions each containing a non-chemically-amplified naphthoquinonediazide photosensitizer and a cresol novolak resin. They are neither chemically amplified resist compositions nor compositions each containing a predetermined amount of an octanone as in the present invention and are still susceptible to improvement in definition and depth of focus. In such a chemically amplified resist, a resist is patterned by the reaction between an acid generated from an acid generator upon irradiation with light and a base resin having an acid-decomposable dissolution inhibiting group.

Japanese Unexamined Patent Application Publication No. 6-130665 proposes a chemically amplified resist using 2-octanone or 3-octanone as a resist solvent. However, the use of 2-octanone or 3-octanone as the solvent cannot yield desired definition and depth of focus.

SUMMARY OF THE INVENTION

Accordingly, an object of the present invention is to provide a chemically amplified positive resist composition having improved definition and depth of focus.

The above-noted objects can be achieved by incorporating an (D)octanone into (B)a resin which exhibits increased solubility in an alkali aqueous solution by action of an acid, in a coating composition for a chemically amplified positive resist, in proportion of from 0.1 to 5 parts by weight of (D), relative to 100 parts by weight of (B).

Specifically, the present invention is a coating composition for a chemically amplified positive resist comprising (A) an acid generator which generates an acid upon irradiation with active light or radiant ray, (B) a resin ingredient which exhibits increased solubility in an alkali aqueous solution by action of an acid, (C) an organic solvent, and (D) an octanone, in a proportion of from 0.1 to 5 parts by weight relative to 100 parts by weight of the ingredient (B).

More specifically, the present invention is a coating composition for a chemically amplified positive resist produced by dissolving (A) an acid generator which generates an acid upon irradiation with active light or radiant ray and (B) a resin ingredient which exhibits increased solubility in an alkali aqueous solution by action of an acid, into (C) an organic solvent, characterized in the (D) octanone is formulated in a proportion of from 0.1 to 5 parts by weight relative to 100 parts by weight of the ingredient (B)

In another aspect, the present invention provides a method of patterning a resist, including the steps of applying a film of the aforementioned coating composition for a chemically amplified positive resist onto a substrate, prebaking the applied film at a temperature in the range of from 80° C. to 120° C., irradiating the prebaked film with active light or radiant ray through a patterned mask, subjecting the exposed film to post-exposure baking at a temperature in the range of from 80° C. to 130° C., and subjecting the resulting film to alkali-development.

DETAILED DESCRIPTION OF THE INVENTION

Ingredient (A)

Ingredients (A) for use in the present invention are not specifically limited and include any compounds that generate an acid upon irradiation with active light or radiant ray. The acid generator can appropriately be selected from conventional acid generators such as iodonium salts, sulfonium salts, and other onium salts; oxime sulfonates; bis(alkylsulfonyl)diazomethanes, bis(cycloalkylsulfonyl)diazomethanes, bis(arylsulfonyl)diazomethanes, nitrobenzylsulfonates, iminosulfonates, and disulfones. Among them, bis(alkylsulfonyl)diazomethanes, bis(cycloalkylsulfonyl)diazomethanes and bis(arylsulfonyl)diazomethanes are preferred.

Such diazomethanes include, for example, bis(n-propylsulfonyl)diazomethane, bis(isopropylsulfonyl)diazomethane, bis(n-butylsulfonyl)diazomethane, bis(isobutylsulfonyl)diazomethane, bis(tert-butylsulfonyl)diazomethane, and other bis(alkylsulfonyl)diazomethanes each having a straight- or branched-chain alkyl group; bis(cyclopentylsulfonyl)diazomethane, bis(cyclohexylsulfonyl)diazomethane, and other bis(cycloalkylsulfonyl)diazomethanes each having a cyclic alkyl group; and bis(phenylsulfonyl)diazomethane, bis(p-methyphenylsulfonyl)diazomethane, bis (2,4-dimethylphenylsulfonyl)diazomethane, bis(p-methoxyphenylsulfonyl)diazomethane, and other bis(arylsulfonyl)diazomethanes each having a substituted or unsubstituted phenyl group.

The content of the ingredient (A) is preferably from 0.5 to 20 parts by weight and more preferably from 1 to 10 parts by weight, relative to 100 parts by weight of the ingredient (B).

Ingredient (B)

Ingredients (B) for use in the present invention are not specifically limited and include any resins which exhibit increased solubility in an alkaline aqueous solution by action of an acid. Such resins may be derived from known or conventional alkali-soluble resins, in which phenolic hydroxyl groups or hydroxyl groups of carboxyl groups of the resins are protected with an acid-decomposable dissolution inhibiting group, and the resulting resins become insoluble in an alkali. The dissolution inhibiting group in the resins is decomposed by action of an acid generated from the acid generator, and the resulting resins become soluble in an alkali.

As the ingredient (B), preferred are polymers each having a unit in which hydrogen atoms of hydroxy groups of hydroxystyrene are substituted with an "acetal" group serving as the acid-decomposable dissolution inhibiting group. Such acetal groups include, for example, ethoxyethyl group, methoxypropyl group and other lower alkoxyalkyl groups. Such polymers have excellent sensitivity, definition and good resist pattern profiles.

Specifically, preferred resins are resins derived from polyhydroxystyrenes, hydroxystyrene-styrene copolymers and copolymers of hydroxystyrene and (meth)acrylic acid or a (meth)acrylic ester, in which the hydroxystyrene unit is substituted with the acetal group.

To further improve definition and heat resistance, the resin ingredient preferably comprises both the acetal group and an acid-decomposable dissolution inhibiting group other than the acetal group. Such acid-decomposable dissolution inhibiting groups include, but are not limited to, tert-butoxycarbonyl group and other tertiary-alkyloxycarbonyl groups; tert-butoxycarbonylmethyl group and other tertiary-alkyloxycarbonyl-substituted alkyl groups; tert-butoxy group and other tertiary alkyl groups; and tetrahydropyranyl group, tetrahydrofuranyl group and other cyclic ether groups, and other conventional acid-decomposable dissolution inhibiting groups. In this case, the resin may be a resin blend as mentioned below or a copolymer containing a hydroxystyrene unit, a hydroxystyrene unit substituted with the acetal group, and a hydroxystyrene unit substituted with a dissolution inhibiting group other than the acetal group.

The ingredient (B) preferably comprises (b) a resin derived from a polymer having a weight average molecular weight of from 3000 to 30000 and a molecular weight distribution of from 1.0 to 6.0 and containing a hydroxystyrene unit, in which from 10% to 50% of the hydrogen atoms of hydroxy groups of the hydroxystyrene unit are substituted with an alkoxyalkyl group.

To efficiently produce resins having stable characteristics at low costs, the ingredient (B) is more preferably a blend of (b-a) a resin derived from a polyhydroxystyrene having a weight average molecular weight of from 3000 to 30000 and a molecular weight distribution of from 1.0 to 6.0, in which from 10% to 50% of the hydrogen atoms of hydroxyl groups of the polyhydroxystyrene are substituted with tert-butoxycarbonyl group, and (b-b) a resin derived from a polyhydroxystyrene having a weight average molecular weight of from 3000 to 30000 and a molecular weight distribution of from 1.0 to 6.0, in which from 10% to 50% of the hydrogen atoms of hydroxyl groups of the polyhydroxystyrene are substituted with an alkoxyalkyl group, and in the ingredient (B), the weight ratio of the resin (b-a) to the resin (b-b) falls within a range from 10:90 to 90:10.

Alternatively, the ingredient (B) is preferably a blend of the resin (b-b) and a resin (b-c) derived from a polyhydroxystyrene having a weight average molecular weight of from 3000 to 30000 and a molecular weight distribution of from 1.0 to 6.0, in which from 10% to 50% of the hydrogen atoms of hydroxyl groups of the polyhydroxystyrene are substituted with tetrahydropyranyl group, and the weight ratio of the resin (b-c) to the resin (b-b) in the blend falls within a range from 10:90 to 90:10.

Organic Solvent Ingredient (C)

Organic solvents (C) for use in the present invention are not specifically limited as long as they can dissolve the ingredients (A) and (B), have miscibility with the octanone (D) and can yield uniform resist coating compositions. The organic solvent can freely be selected from conventional resist solvents such as ether solvents, ester solvents, and ketone solvents other than octanones.

The ether solvents include, but are not limited to, alkylene glycol monoalkyl ethers, such as monomethyl, monoethyl, monopropyl, monobutyl, and other lower-alkyl ethers of glycols such as ethylene glycol, propylene glycol, diethylene glycol and dipropylene glycol.

The ester solvents include, but are not limited to, alkylene glycol monoalkyl ether acetates such as acetates of the aforementioned alkylene glycol monoalkyl ethers; methyl lactate, ethyl lactate, methyl methoxypropionate, ethyl ethoxypropionate, and other alkyl lactates; ethyl acetate, propyl acetate, butyl acetate, and other alkyl acetates.

The ketone solvents include, but are not limited to, acetone, methyl ethyl ketone, cyclopentanone and 2-heptanone.

The content of the ingredient (C) is preferably from 100 to 1000 parts by weight and more preferably from 300 to 800 parts by weight, relative to 100 parts by weight of the ingredient (B).

Octanone Ingredient (D)

The most significant feature of the present invention is the use of an octanone in a proportion of from 0.1 to 5 parts by weight relative to 100 parts by weight of the ingredient (B). The resulting coating composition exhibits improved definition and depth of focus. This is probably because, by using the specific amount of the octanone having a higher boiling point than the organic solvent ingredient (C), the octanone remains in the resulting resist film formed from the coating composition on a substrate, and the remained octanone serves to improve definition and depth of focus. In this connection, the boiling points of 2-octanone and 3-octanone are 173° C. and 167–168° C., respectively. If the content of the octanone ingredient (D) is out of the above-specified range, the significant advantages are not obtained. The content is more preferably from 1 to 5 parts by weight relative to 100 parts by weight of the ingredient (B).

Additional Ingredients

The coating composition of the present invention may further comprise additional ingredients according to necessity. Such additional ingredients include, but are not limited to, salicylic acid, malonic acid, and other carboxylic acids; triethylamine, tributylamine, dibutylamine, triethanolamine, and other secondary or tertiary amines, of which triethylamine, tributylamine, triethanolamine, and other tertiary amines are preferred.

The contents of such additional ingredients depend on the types of the ingredients. For example, the content of tertiary amines is preferably from 0.01 to 1.0 part by weight, and the content of carboxylic acids is preferably from 0.01 to 1.0 part by weight, respectively, relative to 100 parts by weight of the ingredient (B).

Patterning of Resist

According to the present invention, a resist is patterned by applying a film of the coating composition for a chemically amplified positive resist onto a substrate, prebaking the applied film at a temperature in the range of from 80° C. to 120° C., irradiating the prebaked film with active light or radiant ray through a patterned mask, subjecting the exposed film to post-exposure baking at a temperature in the range of from 80° C. to 130° C., and subjecting the resulting film to alkali-development.

To allow the octanone to remain in the resulting resist film formed on the substrate, the prebaking prior to exposure and the post-exposure baking are preferably performed at temperatures of from 80° C. to 120° C. and from 80° C. to 130° C., respectively, in the lithography process.

The other procedures in the lithography process can be performed in accordance with conventional techniques. Specifically, a resist may be patterned in the following manner. Initially, the coating composition of the present invention is applied onto a substrate, for example, by spin coating and is subjected to pre-baking. Next, the prebaked film is patterned by irradiating the film with light such as KrF excimer layer, ArF excimer laser, $F_2$ laser, vacuum ultraviolet rays, electron beams and X-rays, is then subjected to post-exposure baking and is subjected to development in an alkaline aqueous solution. The post-exposure baking operation may not always be required.

The present invention will be described in further detail with reference to several examples and comparative examples below, which are not intended to limit the scope of the invention.

EXAMPLE 1

6 parts by weight of bis(cyclohexylsulfonyl) diazomethane was used as the ingredient (A).

A mixture of 25 parts by weight of (b-c) a polyhydroxystyrene having a molecular weight distribution (Mw/Mn) of 1.2 and a weight average molecular weight (Mw) of 8000, in which 30% of hydroxyl group were substituted with tetrahydropyranyl group, and 75 parts by weight of (b-b) a polyhydroxystyrene having a molecular weight distribution (Mw/Mn) of 1.2 and a weight average molecular weight (Mw) of 8000 in which 39% of hydroxyl group were substituted with 1-ethoxyethyl group was used as the ingredient (B).

670 parts by weight of propylene glycol monomethyl ether acetate was used as the organic solvent (C).

As the ingredient (D), 2 parts by weight of 3-octanone was used.

The ingredient (A), (B), (D), 0.1 part by weight of triethylamine, 0.13 part by weight of salicylic acid and 0.08 part by weight of a fluorinated silicon-based surfactant R08 (produced by DAINIPPON INK AND CHEMICALS, INC., the trade name) were dissolved in 670 parts by weight of propylene glycol monomethyl ether acetate as the organic solvent (C), and the resulting solution was filtrated through a 0.2-$\mu$m membrane filter and thereby yielded a positive resist coating composition.

The positive resist coating composition was applied onto a 6-inch silicon wafer by spin coating, was dried on a hot plate at 90° C. for 90 seconds and thereby yielded a resist layer 0.56 $\mu$m thick.

The resist film was then selectively irradiated with KrF excimer laser (248 nm) using a reducing-type projection aligner (produced by Canon Inc., under the trade name of FPA-3000 EX3; NA=0.60), was subjected to post-exposure baking (PEB) at 110° C. for 90 seconds, was subjected to puddle developing in a 2.38% by weight tetramethylammonium hydroxide aqueous solution at 23° C. for 60 seconds, was rinsed with pure water for 30 seconds, was further subjected to post-exposure baking at 100° C. for 60 seconds and thereby yielded a patterned positive resist.

The above-patterned positive resist included hole diameter 180-nm hole patterns with good sectional shapes (profiles) at an exposure of 57 mJ/cm$^2$ with a depth of focus of 0.8 $\mu$m and a critical definition of 160 nm hole diameter.

EXAMPLE 2

A positive resist coating composition was prepared in the same manner as in Example 1, except that 2 parts by weight of 2-octanone was used instead of 3-octanone, and the characteristics of the resulting resist were determined in the same manner as in Example 1. As a result, hole diameter 180-nm hole patterns were formed with good sectional shapes (profiles) at an exposure of 57 mJ/cm$^2$ with a depth of focus of 0.8 $\mu$m and a critical definition of 170 nm hole diameter.

COMPARATIVE EXAMPLE 1

Coating Composition Comprising no Octanone

A positive resist coating composition was prepared in the same manner as in Example 1, except that 3-octanone was not used, and the characteristics of the resulting resist were determined in the same manner as in Example 1. As a result, hole diameter 180-nm hole patterns were formed with deteriorated sectional shapes (profiles) at an exposure of 57 mJ/cm$^2$ with a depth of focus of 0.6 $\mu$m.

COMPARATIVE EXAMPLE 2

Coating Composition Containing 10 Parts by weight of Octanone

A positive resist coating composition was prepared in the same manner as in Example 1, except that 10 parts by weight of 3-octanone was used, and the characteristics of the resulting resist were determined in the same manner as in Example 1. As a result, hole diameter 200-nm hole patterns were formed with deteriorated sectional shapes (profiles) at an exposure of 50 mJ/cm$^2$ with a depth of focus of 0.4 $\mu$m.

Other embodiments and variations will be obvious to those skilled in the art, and this invention is not to be limited to the specific matters stated above.

What is claimed is:

1. A coating composition for a chemically amplified positive resist, comprising:
   (A) an acid generator which generates an acid upon irradiation with active light or radiant ray;
   (B) a resin ingredient which exhibits increased solubility in an alkali aqueous solution by action of an acid;
   (C) an organic solvent; and
   (D) an octanone in a proportion of from 0.1 to 5 parts by weight relative to 100 parts by weight of the ingredient (B).

2. The coating composition according to claim 1, wherein the ingredient (D) is 2-octanone or 3-octanone.

3. The coating composition according to claim 1, wherein the ingredient (C) is one selected from the group consisting of ether solvents, ester solvents, ketone solvents other than octanones and combinations thereof.

4. The coating composition according to claim 3, wherein the ingredient (C) is one selected from the group consisting of alkylene glycol monoalkyl ethers, alkylene glycol monoalkyl ether acetates, alkyl lactates, alkyl acetates, 2-heptanone and combinations thereof.

5. The coating composition according to claim 1, wherein the ingredient (B) comprises (b) a resin derived from a polymer having a weight average molecular weight of from 3000 to 30000 and a molecular weight distribution of from 1.0 to 6.0 and containing a hydroxystyrene unit, in which from 10% to 50% of the hydrogen atoms of hydroxy groups of the hydroxystyrene of the polymer are substituted with an alkoxyalkyl group.

6. The coating composition according to claim 1, wherein the ingredient (B) comprises:
   (b-a) a resin derived from a polyhydroxystyrene having a weight average molecular weight of from 3000 to 30000 and a molecular weight distribution of from 1.0 to 6.0, in which from 10% to 50% of the hydrogen atoms of hydroxyl groups of the polyhydroxystyrene are substituted with tert-butoxycarbonyl group; and (b-b) a resin derived from a polyhydroxystyrene having a weight average molecular weight of from 3000 to 30000 and a molecular weight distribution of from 1.0 to 6.0, in which from 10% to 50% of the hydrogen atoms of hydroxyl groups of the polyhydroxystyrene are substituted with an alkoxyalkyl group, wherein the weight ratio of the resin (b-a) to the resin (b-b) falls within a range from 10:90 to 90:10.

7. The coating composition according to claim 1, wherein the ingredient (B) comprises:

(b-c) a resin derived from a polyhydroxystyrene having a weight average molecular weight of from 3000 to 30000 and a molecular weight distribution of from 1.0 to 6.0, in which from 10% to 50% of the hydrogen atoms of hydroxyl groups of the polyhydroxystyrene are substituted with tetrahydropyranyl group; and (b-b) a resin derived from a polyhydroxystyrene having a weight average molecular weight of from 3000 to 30000 and a molecular weight distribution of from 1.0 to 6.0, in which from 10% to 50% of the hydrogen atoms of hydroxyl groups of the polyhydroxystyrene are substituted with an alkoxyalkyl group, wherein the weight ratio of the resin (b-c) to the resin (b-b) falls within a range from 10:90 to 90:10.

8. The coating composition according to claim 1, further comprising 0.01 to 1.0 part by weight of a secondary or tertiary aliphatic amine relative to 100 parts by weight of the ingredient (B).

9. The coating composition according to claim 1, further comprising 0.01 to 1.0 part by weight of a carboxylic acid relative to 100 parts by weight of the ingredient (B).

10. The coating composition according to claim 1, wherein the ingredient (A) is a bissulfonyldiazomethane.

11. The coating composition according to claim 10, wherein the ingredient (A) is one selected from the group consisting of bis(alkylsulfonyl)diazomethanes, bis(cycloalkylsulfonyl)diazomethanes, bis(arylsulfonyl)diazomethanes and combinations thereof.

12. A method of patterning a resist, the method comprising the steps of: applying a film of the coating composition for a chemically amplified positive resist as claimed in claim 1 onto a substrate; prebaking the applied film at a temperature in the range of from 80° C. to 120° C.; irradiating the prebaked film with active light or radiant ray through a patterned mask; subjecting the irradiated film to post-exposure baking at a temperature in the range of from 80° C. to 130° C.; and subjecting the resulting film to alkali-developing.

* * * * *